United States Patent [19]

Goodyear et al.

[11] Patent Number: 5,532,190

[45] Date of Patent: Jul. 2, 1996

[54] PLASMA TREATMENT METHOD IN ELECTRONIC DEVICE MANUFACTURE

[75] Inventors: Andrew L. Goodyear, Clevedon; Ian D. French, Hove, both of England

[73] Assignee: U.S. Philips Corporation, New York, N.Y.

[21] Appl. No.: 442,579

[22] Filed: May 15, 1995

[30] Foreign Application Priority Data

May 26, 1994 [GB] United Kingdom ............. 9410567

[51] Int. Cl.$^6$ .................................................. H01L 21/302
[52] U.S. Cl. .................... 437/225; 118/715; 118/723 R; 118/723 E; 156/345; 437/228
[58] Field of Search ............................ 118/715, 723 R, 118/723 E; 156/345 V, 345 P; 437/225, 228

[56] References Cited

U.S. PATENT DOCUMENTS

| | | | |
|---|---|---|---|
| 3,854,443 | 12/1974 | Baerg | 118/49 |
| 4,810,322 | 3/1989 | Gut | 156/345 |
| 4,980,204 | 12/1990 | Fujii | 427/255.2 |
| 5,269,847 | 12/1993 | Anderson | 118/715 |
| 5,453,124 | 9/1995 | Moslehi et al. | 118/715 |

FOREIGN PATENT DOCUMENTS

| | | |
|---|---|---|
| 0561462 | 9/1993 | European Pat. Off. |
| 56-87328 | 7/1981 | Japan . |
| 61-05515 | 1/1986 | Japan ............ 118/715 |
| 61-87872 | 5/1986 | Japan . |
| 61-261485 | 11/1986 | Japan . |
| 62-81089 | 4/1987 | Japan ............ 118/715 |
| 62-290885 | 12/1987 | Japan . |
| 63-53932 | 3/1988 | Japan ............ 118/715 |
| 1223724 | 9/1989 | Japan ............ 118/715 |

Primary Examiner—R. Bruce Breneman
Assistant Examiner—Ramamohan Rao Paladugu
Attorney, Agent, or Firm—Michael E. Schmitt

[57] ABSTRACT

In the manufacture of a large-area electronic device such as a large-area liquid-crystal display device with thin-film address and drive circuitry, a plasma treatment is carried out on a device substrate (4) which is mounted on a supporting electrode (11) facing a perforated gas-feeding electrode (12). A reactive plasma (5) is generated in a space between the electrodes (11, 12) from a mixture of reaction gases which is fed into the space through at least the perforated electrode (12). The mixture of gases comprises a first reaction gas (e.g. $SiH_4$) which is depleted at a faster rate in the plasma treatment than a second reaction gas (e.g $N_2$). Through an area (12b) of the perforated electrode, one or more second supply lines (22) feeds a secondary mixture which is richer in the first reaction gas than a primary mixture supplied by a first supply line (21). This arrangement permits the plasma treatment to be carried out more uniformly over the area of the supporting electrode (11), by fine tuning the gas composition in depleted areas after the main aspects of the process performance (e.g temperature, pressure, reactant gases, composition of the primary mixture) have been determined in accordance with the desired plasma treatment properties.

9 Claims, 2 Drawing Sheets

PLASMA TREATMENT METHOD IN ELECTRONIC DEVICE MANUFACTURE

This invention relates to methods of manufacturing electronic devices in which a plasma treatment (for example thin-film deposition or an etching treatment) is carried out on a device substrate which is mounted on a supporting electrode facing a perforated gas-feeding electrode. The invention also relates electronic devices manufactured by such a method and to apparatus for such plasma treatment. The device may be a monolithic semiconductor integrated circuit, but the invention is especially advantageous for the manufacture of large-area devices which may comprise thin-film circuitry on an insulating substrate. Such a device with thin-film circuitry may be, for example, an active-matrix liquid-crystal display or other flat panel display, or any other type of large area electronic device, for example, a thin-film data store or an image sensor.

BACKGROUND OF THE INVENTION

Plasma treatments are often used in the manufacture of such electronic devices. The plasma treatment is carried out on a device substrate which is mounted on a supporting electrode facing a perforated gas-feeding electrode in the apparatus. A reactive plasma is generated in the space between the electrodes from a mixture of reaction gases which is fed into the space through at least the perforated electrode. From the English language abstract of published Japanese Patent Application Kokai JP-A-56-87328 in Patent Abstracts of Japan and the drawings of JP-A-56-87328 (hereby incorporated herein as reference material), such a method and apparatus are know in which the mixture of gases flows in a direction across the substrate from a first area of the space to which it is supplied by a first supply line, and a second supply line feeds a second area of the space through the perforated electrode; the second area is along the flow direction from the first area.

In the arrangement of JP-A-56-87328, the gas mixture is supplied to the perforated electrode by the first supply line feeding a central area of the perforated electrode and by the second supply line feeding a peripheral area of the perforated electrode. The gas flow over the substrate is radially outwards from the central area. In this known apparatus and method the same gas mixture is fed to both the peripheral and central areas, but at different rates which are controlled by a first mass flow meter on the first supply line and a second mass flow meter on the second supply line. This permits a reduction of non-uniformities in the plasma between the central area and the peripheral area. Such a plasma treatment may be used for the deposition of a silicon nitride film, for example from a mixture of silane ($SiH_4$) and ammonia ($NH_3$).

Plasmas used in processing treatments are extremely complex, and many of the details of physical and chemical interactions both within the plasma and with surfaces exposed to the plasma are not yet understood. This situation pertains in even the well known silicon nitride deposition process from $SiH_4$ and $NH_3$. The present inventors find that, in spite of adjusting different flow rates in the peripheral and central areas, significant non-uniformities can still occur in the thickness, composition and quality of the deposited film. The non-uniformities are especially noticeable when the film is deposited over large areas, for example with electrode areas of about 0.5 $m^2$ ($meter^2$) and more, e.g of the order of 1 $m^2$ ($meter^2$). Similar non-uniformities can occur in other large-area plasma treatments, for example in plasma etching treatments using mixtures of reaction gases for etching over large areas.

SUMMARY OF THE INVENTION

It is an aim of the present invention to provide a means of correcting for, or at least reducing, such non-uniformities.

According to a first aspect of the present invention, there is provided a method of manufacturing an electronic device in which a plasma treatment is carried out on a device substrate which is mounted on a supporting electrode facing a perforated gas-feeding electrode, a reactive plasma being generated in a space between the electrodes from a mixture of reaction gases which is fed into the space through at least the perforated electrode, wherein the mixture of gases flows in a direction across the substrate from a first area of the space to which it is supplied by a first supply line, and a second supply line feeds a second area of the space through the perforated electrode, the second area being along the flow direction from the first area; such a method in accordance with the present invention is characterised in that the mixture of gases comprises a first reaction gas which is depleted at a faster rate in the plasma treatment than a second reaction gas in the mixture, and in that the second supply line supplies a secondary mixture which is richer in the first reaction gas than a primary mixture supplied by the first supply line whereby the plasma treatment is carried out more uniformly over the area of the supporting electrode.

According to a second aspect of the invention there is provided plasma treatment apparatus comprising a chamber in which a supporting electrode is mounted facing a perforated gas-feeding electrode, means for applying an electric field between the electrodes for generating a reactive plasma in a space between the electrodes from a mixture of reaction gases which is fed into the space through the perforated electrode, first and second supply lines for supplying the gas mixture to the space, the first supply line feeding a first area of the space from which the gas mixture flows to a second area of the space, the second supply line feeding the second area through the perforated electrode, and gas outlet means from the chamber so located in relation to the supporting electrode that the gas mixture flows in a direction across the substrate from the first area; in accordance with the present invention the apparatus is characterised in that the first and second supply lines are connected to separate respective primary and secondary supplies of the mixture, each of which comprises a first reaction gas which is depleted at a faster rate in the plasma treatment than a second reaction gas in the mixture, and in that the secondary supply is richer in the first reaction gas than the primary supply, whereby the plasma treatment is carried out more uniformly over the area of the supporting electrode.

The present invention is based on a recognition that non-uniformities in plasma treatments over large areas can result from the different reaction gases in the gas mixture being depleted at different rates in the particular treatment (whether deposition, or etching, or whatever) and that the effect of the different depletion rates over the large areas can be most easily compensated (at least partially) by supplying to the second area a mixture which is richer in the reaction gas which depletes at a faster rate. This approach permits the gas parameters to be determined first by the desired device characteristics from the plasma treatment (e.g the composition and quality of a deposited film), and then it permits achievement of these gas parameters by controlling the flow rates and gas composition of the separate supply lines.

The plasma treatment may involve depositing material on a surface of the substrate. In a particular example, the first reaction gas may be silane ($SiH_4$), the second reaction gas may comprise nitrogen, and the deposited material may be silicon nitride. In this example the second reaction gas may be nitrogen ($N_2$) or ammonia ($NH_3$).

The plasma treatment may involve etching away material from a surface of the substrate. In a particular example, the first reaction gas may be $SF_6$, the second reaction gas may be $CHF_3$, and the etched away material may be silicon nitride or, for example, silicon carbide. The different primary and secondary mixtures in accordance with the invention may be utilised in this situation to compensate for changes in etch rate and etch profile over large areas.

Methods and apparatus in accordance with the invention may be used with various reactor chamber geometries. The currently most popular arrangements involve either a radial gas flow or a longitudinal gas flow. In the first case, the first supply line may feed the gas mixture through a central area of the perforated electrode, and one or more second supply lines may feed the gas mixture through a peripheral area or areas of the perforated electrode, the direction of gas flow over the supporting electrode being radially outward from the first (central) area of the space. As described below, an arrangement with a radially inward gas flow is also possible. In the second case, the first supply line may feed a first peripheral area of the space through an inlet separate from the perforated electrode, and the direction of gas flow over the supporting electrode is longitudinally across the supporting electrode, from the first peripheral area to an opposite peripheral area of the space; one or more second supply lines feed the perforated electrode.

BRIEF DESCRIPTION OF THE DRAWING FIGURES

These and other features of the present invention, and their advantages, are illustrated specifically in embodiments of the invention now to be described, by way of example, with reference to the accompanying diagrammatic drawings, in which.

Figure 1:
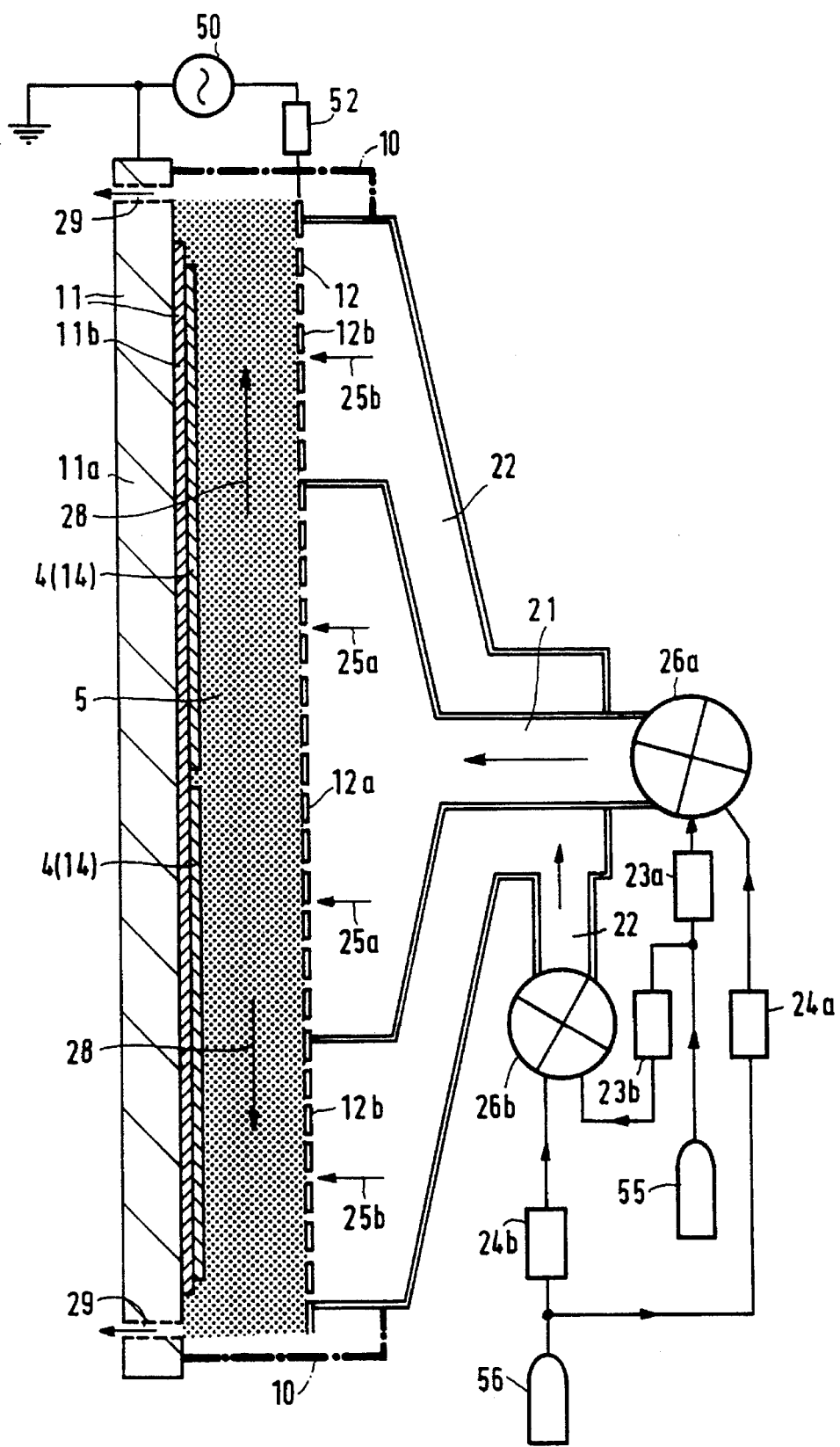
FIG. 1 is a part cross-sectional view and a part schematic diagram of plasma-treatment apparatus in accordance with the present invention being used in the manufacture of an electronic device by a method in accordance with the invention.

It should be noted that all the drawings are diagrammatic and not drawn to scale. Relative dimensions and proportions of parts of these Figures have been shown exaggerated or reduced in size for the sake of clarity and convenience in the drawings. The same reference signs are generally used to refer to corresponding or similar features in the different embodiments.

DESCRIPTION OF THE INVENTION

FIG. 1 shows a plasma reactor of the so-called "capacitively-coupled large-area parallel-plate" type having a radial gas flow. The reactor comprises a reaction chamber 10 in which a supporting electrode 11 is mounted facing a perforated electrode 12. The plasma treatment is carried out at the surface of one or more device substrates 4(14) mounted on the supporting electrode 11. The supporting electrode 11 is grounded. A radio frequency voltage is applied to the perforated electrode 12 from an RF source 50 via an impedance matching network 52. By this means 50, 52, an AC electric field is applied between the electrodes 11 and 12, for generating a reactive plasma 5 in a space between the electrodes 11 and 12 from a mixture 25 of reaction gases which is fed out through the perforated electrode 12. The assembly of the perforated electrode 12 and its gas supply means 21 and 22 form a so-called "shower head" which derives its name from the fact that the gases are fed into this space through the perforated electrode 12. The plasma reactor as described so far may be regarded as being of a known type such as is used for plasma-enhanced deposition or plasma etching of thin films in monolithic integrated circuits and/or in large-area electronic devices such as liquid-crystal displays.

Large-area electronic devices have substrates 4(14) of large area, as compared with monolithic integrated circuit wafers. One or more of these substrates 4(14) are mounted on the electrode 11 which thus also is of large area. Consequently, a very large reaction chamber 10 is required. For large flat-panel displays and other large-area electronic devices with thin-film circuit elements the trend is towards electrode areas of the order of 1 $m^2$ ($meter^2$). Especially in this thin-film circuit application, good uniformity in the plasma treatment is required over large areas of the supporting electrode 11. For this purpose, it is advantageous to have several (e.g first and second) supply lines 21 and 22 for supplying the gas mixture 25 to the perforated electrode 12. Thus, as illustrated in FIG. 1, the first supply line 21 may feed a central area 12a of the perforated electrode 12, and a second supply line 22 may feed an annular peripheral area 12b of the perforated electrode 12. The chamber 10 has gas outlets 29 connected to a pump (not shown) for sustaining an appropriate pressure in the chamber 10. These outlets 29 are so located in relation to the supporting electrode 11 that the gas flow 28 over the supporting electrode 11 (and the substrate or substrates 4(14) thereon) is radially outwards from the central area.

It is both normal practice and desirable practice to optimise first the main aspects of the plasma treatment process (e.g temperature, pressure, the reaction gases, composition of gas mixture, flow rates etc) so as to achieve the desired properties for the deposited film (or whatever else) that results from the plasma treatment. However, if an identical gas composition is fed via the lines 21 and 22, the present inventors find that (even with adjustment of different flow rates in the separate supply lines 21 and 22) significant depletion of one reaction gas can occur in the plasma reaction in the gas phase and at the surface of the device substrate 4(14) before the gas flow 28 reaches a/the substrate 4(14) at a peripheral area of a large area electrode 11, and so non-uniform deposition or etching occurs over the total area. Thus, the radially-flowing gases from the shower-head 12 are consumed to varying extents by the process reactions in the plasma space. The distribution of gases within the process chamber 10 will therefore be a function of the utilisation rates of the individual gases, as well as a function of the flow arrangement from the perforated electrode areas 12a and 12b. In many cases, severe process non-uniformities result if the present invention is not employed.

Figure 2:
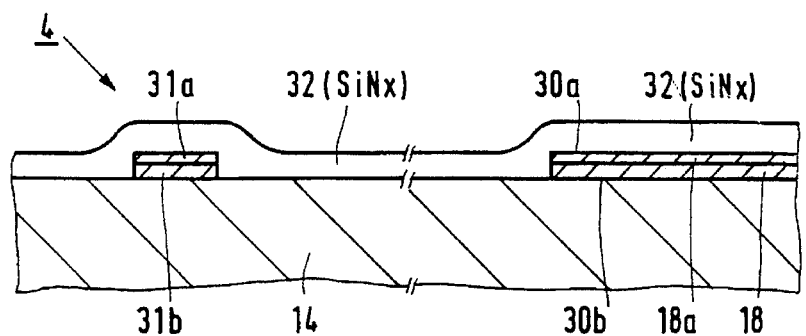
FIGS. 2 and 3 are cross-sectional views of a part of the electronic device at stages in its manufacture in accordance with the present invention.
Figure 3:
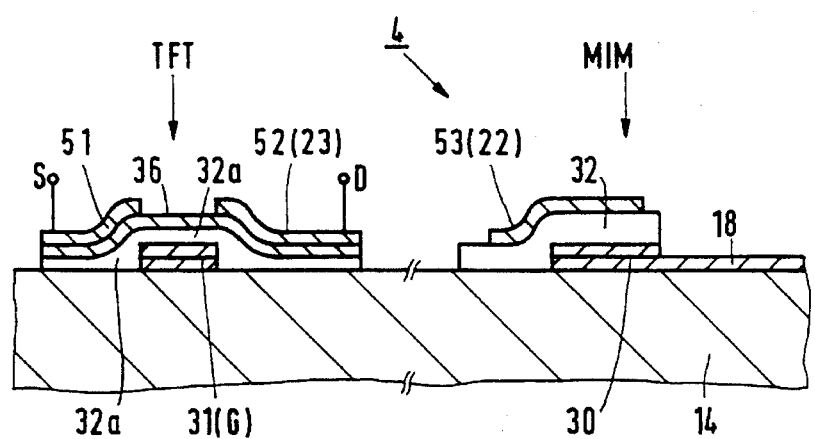

In a particular example with $SiH_4$ and $N_2$ for the plasma enhanced deposition of a thin film 32 of silicon nitride (e.g possibly for MIMs as illustrated in FIGS. 2 and 3), the inventors have found that SiH$_4$ is so much more reactive as to be 20% to 30% depleted in the peripheral areas as compared with the composition in the central area; whereas the N$_2$ is only 0.05% to 0.2% depleted in the peripheral areas as compared with the composition in the central area. The resulting non-uniformity in composition over the whole area of the deposited silicon nitride film 32 can significantly vary the characteristics of MIMs and any other thin-film circuit elements (e.g TFTs) which are formed from the film. Similar non-uniformities occur with the large area deposition of other materials (for example silicon oxynitride and silicon carbide), and may also occur with plasma etching of large areas.

In order to avoid such non-uniformities in accordance with the present invention, the first and second supply lines 21 and 22 are connected to separate respective primary and secondary supplies (23a, 24a, 55, 56) and (23b, 24b, 55, 56) of the gas mixture. Each supply comprises a gas cylinder 55 containing the first reaction gas (e.g SiH$_4$) which is depleted at a faster rate in the plasma treatment than a second reaction gas (e.g N$_2$ or NH$_3$) from a gas cylinder 56. In the arrangement illustrated by way of an example in FIG. 1, both the primary supply (23a, 24a, 55, 56) and the secondary supply (23b, 24b, 55, 56) share a common first cylinder 55 and a common second cylinder 56. In the primary supply, the cylinders 55 and 56 are connected to a valve 26a of the supply line 22 by respective mass flow meters 23a and 24a. In the secondary supply, the cylinders 55 and 56 are connected to a valve 26 of the line 21 by respective mass flow meters 23b and 24b. The settings of the meters 23a, 23b, 24a, 24b are such that more of the first reaction gas (e.g SiH$_4$) flows from meter 23b than from meter 23a, and/or less of the second reaction gas (e.g N$_2$) flows from meter 24b than from meter 24a. In this way, the secondary supply (23b, 24b, 55, 56) provides a peripheral gas mixture 25b which is richer in the first reaction gas than the primary supply (23a, 24a, 55, 56) which provides a central mixture 25a through the electrode area 12a.

This richer supply of the first reaction gas in the peripheral mixture 25b can at least partially compensate for the depletion of the first reaction gas at the peripheral areas of the supporting electrode 11. In this way the plasma treatment may be carried out more uniformly over the whole area of the supporting electrode 11. Furthermore, this approach to improved uniformity permits the main aspects of the process performance (e.g temperature, pressure, composition of the primary gas mixture 25a, flow rates etc) to be optimised first, after which fine tuning of the gas compositions with one or more secondary supplies (23b, 24b, 55, 56) can be performed to adjust the gas mixture(s) 25b so as to compensate for uniformities observed to occur in the operation of that plasma process in the particular equipment. Furthermore, although FIG. 1 illustrates two device substrates 4(14) mounted on the supporting electrode 11, the present invention is especially advantageous for achieving good uniformity over extremely large device substrates 4(14) e.g a device substrate which is so large that only one such substrate 4(14) can be accommodated on the supporting electrode 11 of the plasma-treatment apparatus.

A specific example of the use of the present invention in the manufacture of a large-area electronic device will now be described with reference to FIGS. 2 and 3.

The device comprises thin film circuit elements of the MIM type (derived as an acronym from the English "metallic-insulative-metallic" switching diodes) and of the TFT type (derived as an acronym from the English "thin film transistors"). Apart from the use of a plasma reactor in accordance with the present invention, the method of manufacturing this device may be similar to that described in published European Patent Application EP-A-0 561 462 (our reference PHB 33784), the whole contents of which are hereby incorporated herein as reference material. The present FIGS. 2 and 3 correspond to FIGS. 4 and 2 respectively of EP-A-0 561 462 and have corresponding reference signs to those used in EP-A 0 561 462. The device manufactured in accordance with the present FIGS. 2 and 3 may be, for example, of similar design to the active matrix device of FIG. 1 of EP-A-0 561 462, including a MIM switching array driven by TFT circuitry. The thin-film circuit design and the materials and other parameters of the different features shown in FIGS. 2 and 3 may be similar to those described in EP-A-0 561 462.

Thus the device substrate 4(14) may comprise a plate 14 of glass or other low-cost insulating material. An electrode pattern 18, 30 and 31 may be formed on the insulating plate 14. There is then deposited on this plate 14 with the electrode pattern 18, 30 and 31, a thin film 32 of silicon nitride or of another insulating non-stoichiometric compound material of silicon alloyed with at least one other element. This insulating material may have properties suitable for forming the insulating layer of the MIM devices 53, 32, 30 as illustrated in FIG. 3. The nature of the insulating material 32 may also be such that it may be converted into semiconductive crystalline silicon material by heating with a laser beam in accordance with the invention disclosed in EP-A-0 561 462.

In order to achieve good uniformity of the insulating film 32 over the whole substrate area or areas on the supporting electrode 11, this deposition is carried out in a reactor such as that illustrated in FIG. 1. The supporting electrode 11 comprises a carrier plate 11b on which the device substrates 4(14) are mounted, and a susceptor plate 11a via which the device substrates 4(14) are heated. Depending on the type of reactor, the carrier plate 11b may be mounted on a track via which the device substrates 4(14) may be moved through the apparatus, from one reaction chamber 10 to another reaction chamber 10 for different plasma treatments.

For the deposition of a suitable non-stoichiometric silicon nitride film 32, the device substrates 4(14) may be heated to a low temperature, for example about 200° to 250° C. The gas mixture 25a fed to the central area 12a from the primary supply 23a, 24a, 55, 56 may comprise SiH$_4$ and N$_2$ in a ratio of 1:40. The gas mixture 25b fed to the peripheral area 12b from the secondary supply (23b, 24b, 55, 56) comprises SiH$_4$ and N$_2$ in a smaller ratio, for example 1:25 or 1:30, depending on the flow rates, the relative areas of the peripheral portion 12b and the central portion 12a of the perforated electrode 12, and the area of the supporting electrode 11. In a specific example, the overall areas of the electrodes 11 and 12 may be in the range of 0.5 m$^2$ to 1 m$^2$; the diameter of the central area 12a (fed by supply line 21) may be 40% to 60% of the total diameter of the perforated electrode 12; the openings in the perforated electrode 12 for feeding the gas mixtures 25a and 25b into the space between the electrodes 11 and 12 may be less than 1 mm wide; the size of the space between the electrodes 11 and 12 may be in the range of 3 cm to 4 cm; and the RF frequency of the source 50 may be a conventional 13.56 MHz; the flow rate of the SiH$_4$ through the flow meters 23a and 23b may be the same at, for example, 1 cm$^3$ per minute; the N$_2$ flow rate through the meter 24a may be in the range of 35–40 cm$^3$ per minute, whereas the N$_2$ flow rate through the meter 24b may be in the range of 25 to 30 cm$^3$ per minute. In order to adjust the composition and other properties (e.g film stress) of the deposited film 32, a further reaction gas (e.g H$_2$) may be added to both gas flows 25a and 25b; thus, a H$_2$ gas cylinder may be connected to valves 26a and 26b via respective mass flow meters, so that a H$_2$ gas flow at a rate in the range of, for example, 0 to 200 m$^3$ per minute may be fed to both the lines 21 and 22.

By using different gas compositions in the primary and secondary mixtures 25a and 25b in this way, good uniformity and reproducibility can be obtained for the properties of the film 32, both in the central area of a device substrate 4(14) where the MIM type devices are formed and in a peripheral area where TFTs are formed.

As shown in the present FIG. 3 and as described in EP-A-0 561 462, the fabrication of the MIM devices and TFTs involves a photolithographic and etching stage for etching away excess areas of the thin film throughout its thickness. This etching stage may also be carried out in a plasma reactor such as that illustrated in FIG. 1. Various gas mixtures may be used for the plasma, for example SF$_6$ and CHF$_3$. In this case the gas mixture 25b fed to the peripheral area 12b from the second supply 55b is richer in one reaction gas than the mixture 25a fed to the central area 12a from the first supply 55a, the compositions being adjusted in order to compensate for non-uniformities in etch rates and etch profiles. After this etching step, the device substrate 4(14) is further processed as described in EP-A-0 561 462 to form the completed large-area electronic device, for example a liquid-crystal display device.

It will be evident that many modifications are possible within the scope of the present invention. Thus, for example, in the deposition of a film 32 of silicon nitride, the second reaction gas may be NH$_3$ instead of N$_2$. For plasma-enhanced deposition of silicon oxynitride, gaseous mixtures may be used comprising SiH$_4$ as the first reaction gas and NH$_3$ and nitrous oxide (N$_2$O) as second reaction gases. For plasma-enhanced deposition of a nonstoichiometric silicon carbide film 32, gaseous mixtures may be used comprising SiH$_4$ as the first reaction gas and methane (CH$_4$) as a second reaction gas; hydrogen (H$_2$) may also be included. In each case, the peripheral mixture 25b from the second supply 55b is richer in SiH$_4$ than the central mixture 25a from the first supply 55a.

It will be evident that many other modifications and variations are possible. Thus, for example, instead of the gas outlets 29 being present at the periphery of the reaction chamber 10, the gas outlets 29 from the chamber 10 may be present behind the supporting electrode 11 while still causing a radially outward flow 28 over the supporting electrode 11. The shower head 12, 21, 22 of FIG. 1 comprises only one peripheral feed 22. However, reactors in accordance with the present invention may comprise two or more concentric peripheral feeds 22 each with their own flow controller 23 and their own supplies 55b. The more peripheral of these separate supplies 55b may be richer in the first reaction gas than the less peripheral supplies 55b. Instead of the central and peripheral flows 25a and 25b being always fed to the same fixed areas 12a and 12b of the electrode 12 (as in FIG. 1), a shower head incorporating concentric feed areas 12a, 12b, 12c etc may be used with a slidable piston to control the extent of the areas 12a, 12b, 12c etc through which the gas mixtures 25a or 25b are fed. An example of such a shower head (but without separate supplies 55a or 55b) is disclosed in the English language abstract of published Japanese Patent Application Kokai JP-A-61-87872 in Patent Abstracts of Japan and in the drawings of JP-A-61-87872, which are hereby incorporated herein as reference material.

Instead of a radially outward gas flow 28, the chamber geometry may provide a radially inward gas flow, e.g by having only one gas outlet 29 which is located at the centre of the supporting electrode 11. In this arrangement the flow rates through the meters 23a, 23b, 24a and 24b are such that the central mixture 25a is richer in the first reaction gas (e.g SiH$_4$) than the peripheral mixture 25b.

Figure 4:
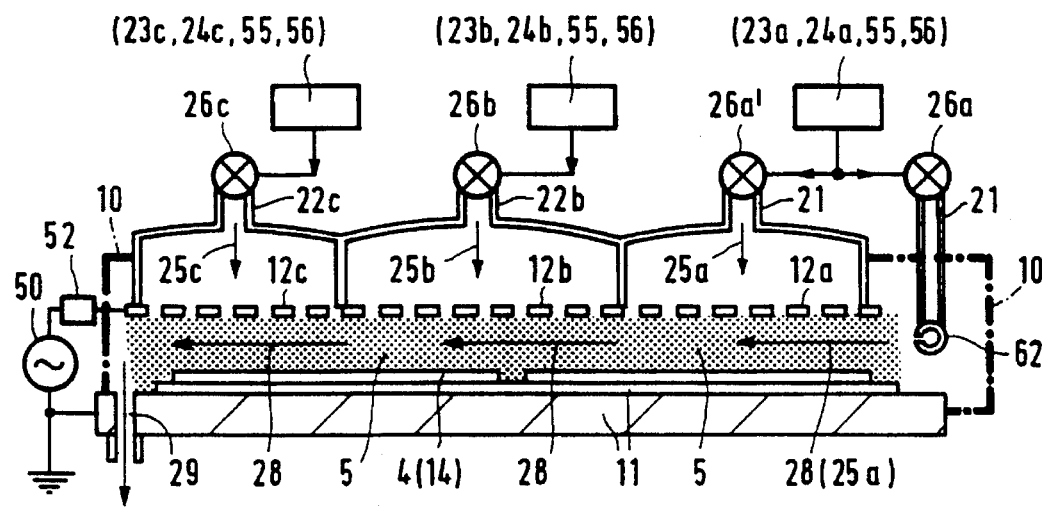
FIG. 4 is a part cross-sectional view and a part schematic diagram of another plasma-treatment apparatus in accordance with the invention.

The invention may be used with other chamber geometries, for example those having a longitudinal gas flow 28 over the supporting electrode 11. One example of a plasma reactor with longitudinal flow 28 is illustrated in FIG. 4. In this example, the first supply line 21 feeds a first peripheral area of the space through an inlet 62 which is separate from the perforated electrode 12. The inlet 62 may be a pipe having openings along its length to feed the gas mixture 25a uniformly into one side of the chamber 10; this perforated pipe 62 is shown in cross-section in FIG. 4. The chamber 10 has an outlet 29 at the opposite side. Thus, the direction of gas flow 28 over the supporting electrode 11 is longitudinally across the electrode 11, from the first peripheral area (with inlet 62) to the opposite peripheral area (with outlet 29).

Two secondary gas mixtures 25b and 25c are fed into the plasma space through the perforated electrode 12 at two successive locations 12b and 12c along the flow direction 28. The gas mixture 25b from a secondary supply (23b, 24b, 55, 56) is richer in the depleting first reaction gas (e.g SiH$_4$) than the primary gas mixture 25a from the primary supply (23a, 24a, 55, 56); and the gas mixture 25c from a secondary supply (23c, 24c, 55, 56) is richer in the depleting first reaction gas (e.g SiH$_4$) than the gas mixture 25b from the supply (23b, 24b, 55, 56). For convenience and simplicity in the drawing of FIG. 4, these primary and secondary supplies are illustrated as separate entities. In practice, as in FIG. 1, these separate supplies are likely to share a common gas cylinder 55 (e.g of SiH$_4$) and a common gas cylinder 56 (e.g of N$_2$) and to derive the gas flows from the cylinders via separate mass flow controllers 23a, 24a for the primary supply 25a, via separate mass flow controllers 23b, 24b for the secondary supply 25b, and via separate mass flow controllers 23c, 24c for the secondary supply 25c. In the chamber arrangement shown in FIG. 4, the primary gas mixture 25a is also fed to a first area 12a of the shower head, adjacent to the separate inlet 62.

From reading the present disclosure, other variations and modifications will be apparent to persons skilled in the art. Such variations and modifications may involve equivalent and other features which are already known in the design, manufacture and use of plasma reactors and their use in plasma treatments for electronic devices comprising MIMs, TFTs and other semiconductor devices and component parts thereof and which may be used instead of or in addition to features already described herein. Although claims have been formulated in this application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of features during the prosecution of the present application or of any further application derived therefrom.

We claim:

1. A method of manufacturing an electronic device in which a plasma treatment is carried out on a device substrate which is mounted on a supporting electrode facing a perforated gas-feeding electrode, a reactive plasma being generated in a space between the electrodes from a mixture of reaction gases which is fed into the space through at least the perforated electrode, wherein a primary mixture of gases flows in a direction across the substrate from a first area of the space to which it is supplied by a first supply line, and a second supply line feeds a secondary mixture of gases to a second area of the space through the perforated electrode, the second area being excluded from the first area and the second area being along the flow direction from the first area, the primary mixture of gases comprising a first reaction gas which is depleted at a faster rate in the plasma treatment than a second reaction gas in the primary mixture, and the second supply line supplying a secondary mixture which is richer in the first reaction gas than the primary mixture supplied by the first supply line, whereby the plasma treatment is carried out more uniformly over the area of the supporting electrode.

2. A method as claimed in claim 1, further characterised in that the plasma treatment involves depositing material on a surface of the substrate.

3. A method as claimed in claim 2, further characterised in that the first reaction gas is silane ($SiH_4$).

4. A method as claimed in claim 3, further characterised in that the second reaction gas comprises nitrogen ($N_2$), and the deposited material is silicon nitride.

5. A method as claimed in claim 4, further characterised in that the second reaction gas is ammonia ($NH_3$).

6. A method as claimed in claim 1, further characterised in that the plasma treatment involves etching away material from a surface of the substrate.

7. A method as claimed in claim 1, further characterised in that the first supply line feeds the primary mixture through a central area of the perforated electrode, and the second supply line feeds the secondary mixture through a peripheral area of the perforated electrode, the direction of gas flow over the supporting electrode being radially outward from the first area of the space.

8. A method as claimed in claim 1, further characterised in that the first supply line feeds a first peripheral area of the space through an inlet separate from the perforated electrode, the direction of gas flow over the supporting electrode being longitudinally across the supporting electrode, from the first peripheral area to an opposite peripheral area of the space.

9. The method of claim 1, wherein the first supply line feed the primary mixture through a central area of the perforated electrode, and the second supply line feeds the secondary mixture through a peripheral area of the perforated electrode, the direction of gas flow over the supporting electrode being radially inward toward the first area of the space.

* * * * *